United States Patent [19]
Murzin et al.

[11] Patent Number: 6,117,772
[45] Date of Patent: Sep. 12, 2000

[54] METHOD AND APPARATUS FOR BLANKET ALUMINUM CVD ON SPHERICAL INTEGRATED CIRCUITS

[75] Inventors: Ivan Herman Murzin, Garland, Tex.; Toshiyuki Sakuma, Tokyo, Japan; Ajay Tapiawala, Dallas, Tex.

[73] Assignee: Ball Semiconductor, Inc., Allen, Tex.

[21] Appl. No.: 09/113,671

[22] Filed: Jul. 10, 1998

[51] Int. Cl.$^7$ .................................................. H01L 21/44
[52] U.S. Cl. ...................... 438/681; 438/677; 118/723 R; 118/716; 427/253; 427/255.28
[58] Field of Search ................................ 438/681, 618, 438/680, 677; 118/723 R, 716; 427/253, 255.28, 255.39

[56] References Cited

U.S. PATENT DOCUMENTS

| | | |
|---|---|---|
| 5,098,483 | 3/1992 | Little et al. |
| 5,178,743 | 1/1993 | Kumar . |
| 5,462,639 | 10/1995 | Matthews et al. .................... 156/662.1 |
| 5,545,591 | 8/1996 | Sugai et al. . |
| 5,877,943 | 3/1999 | Ramamurthi ............................ 361/783 |
| 5,955,776 | 9/1999 | Ishikawa ................................ 257/618 |

FOREIGN PATENT DOCUMENTS

| | | |
|---|---|---|
| 02-119241 | 10/1988 | Japan . |
| 96/29446 | 9/1996 | WIPO . |

OTHER PUBLICATIONS

Aluminum Chemical Vapor Deposition with New Gas Pretreatment Using Tetrakisdimethylamino–titanium for Ultralarge–scale Integrated–circuit Metallization, *American Vacuum Society* Sep./Oct. 1995, pp. 2115–2118.

Using In–Situ Copper Doped Aluminum Chemical Vapor Deposition, IEDM 97, pp. 781–784.

*Primary Examiner*—Caridad Everhart
*Attorney, Agent, or Firm*—Haynes & Boone, LLP

[57] ABSTRACT

A method and apparatus for metal-organics chemical vapor deposition (MO CVD) of a metal layer upon a spherical substrate at atmospheric pressure are disclosed. The method includes pretreating the spherical substrate with a vapor of a first precursor in preparation for a deposition of a metal layer. The pretreated spherical substrate is then exposed to a thermally dissociated precursor of metal for depositing the metal layer onto the spherical substrate, wherein the exposure to the thermally dissociated precursor of metal provides a uniformly deposited metal layer coverage over the pretreated spherical substrate. The deposited metal layer is then annealed and cooled.

44 Claims, 5 Drawing Sheets

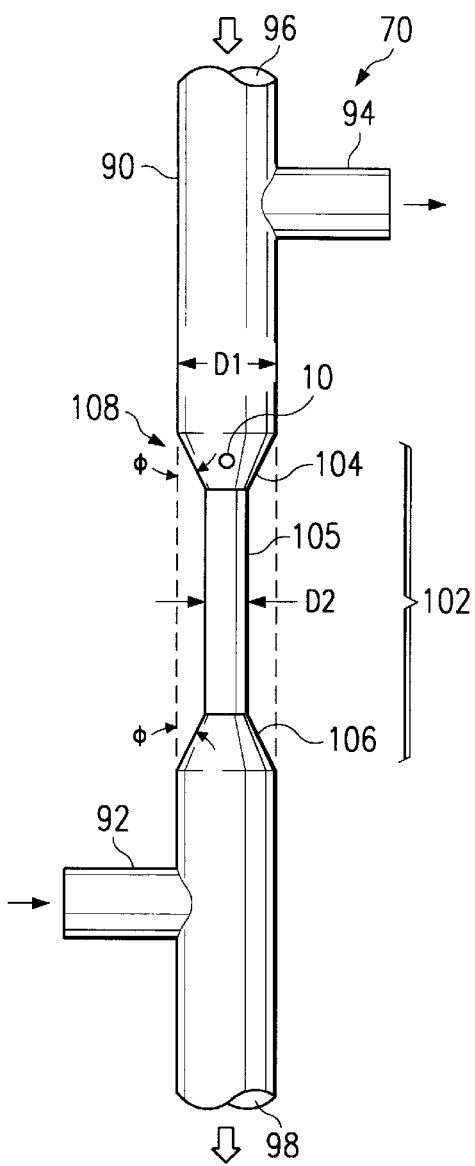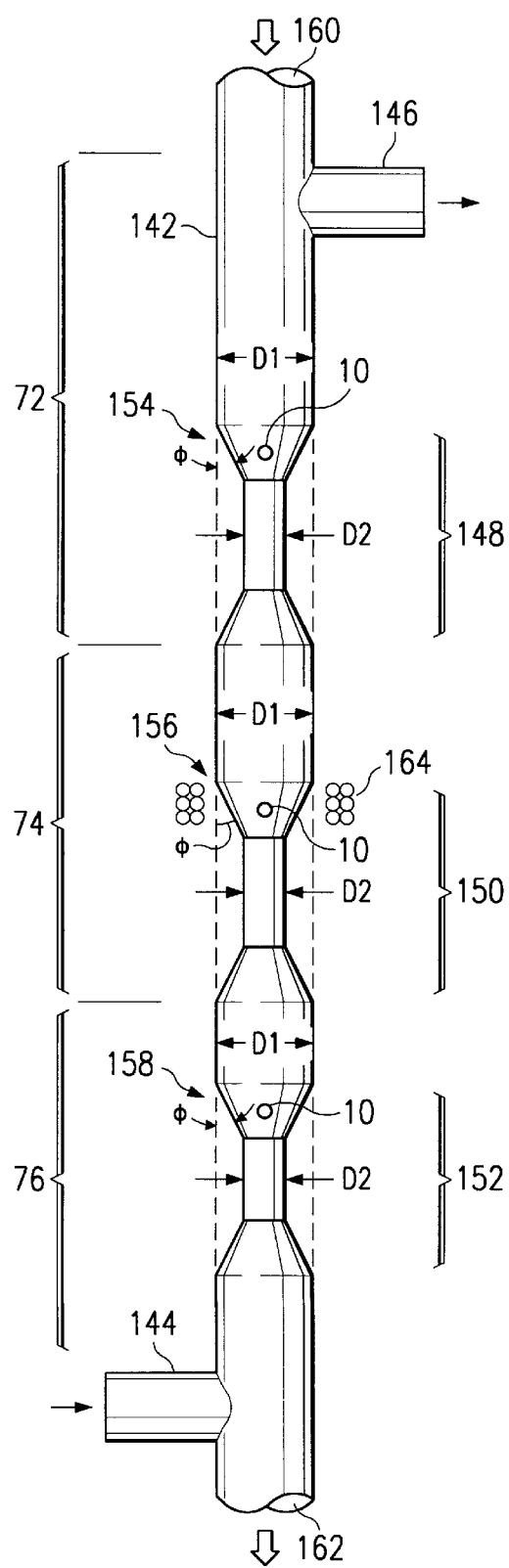

METHOD AND APPARATUS FOR BLANKET ALUMINUM CVD ON SPHERICAL INTEGRATED CIRCUITS

BACKGROUND OF THE INVENTION

1. Field of the Invention

The present invention relates generally to semiconductor integrated circuits, and more particularly, to a method and apparatus for fabricating a spherical-shaped semiconductor device.

2. Discussion of the Related Art

Conventional integrated circuits, or "chips," are formed from a flat surface semiconductor wafer. The semiconductor wafer is typically manufactured in a semiconductor material manufacturing facility and then provided to an integrated circuit fabrication facility. At the latter facility, several layers are processed onto the semiconductor wafer surface. Once completed, the wafer is then cut into one or more chips and assembled into packages. Although the processed chip includes several layers fabricated thereon, the chip still remains relatively flat.

With respect to a conventional semiconductor manufacturing and fabrication facility, the facility is relatively expensive to operate due to the enormous effort and expense required for creating flat silicon wafers and chips. For example, manufacturing of wafers requires several high-precision steps including creating rod-form single crystal semiconductor material; precisely cutting ingots from the semiconductor rods; cleaning and drying the cut ingot sections; manufacturing a large single crystal from the ingots by melting them in a quartz crucible; grinding, etching, and cleaning the surface of the crystal; cutting, lapping and polishing wafers from the crystal; and heat processing the wafers. Moreover, the wafers produced by the above processes typically have many defects which are largely attributable to the difficulty in making a single, highly pure crystal due to the above cutting, grinding and cleaning processes as well as due to various impurities, including oxygen, associated with containers used during the forming of the crystals. These defects become more and more prevalent as feature sizes of integrated circuits formed on these wafers become smaller.

Another major problem associated with modern fabrication facilities for flat chips is that they require extensive and expensive equipment. For example, dust-free clean rooms and precisely-controlled manufacturing and storage areas are necessary to prevent the wafers and chips from defecting and warping. Also, these types of fabrication facilities suffer from a relatively inefficient throughput as well as an inefficient use of the silicon. For example, facilities using in-batch manufacturing, where the wafers are processed by lots, must maintain huge inventories to efficiently utilize all the equipment of the facility. Also, because the wafers are round, and the completed chips are rectangular, the peripheral portion of each wafer cannot be used.

Still another problem associated with modern fabrication facilities is that they do not produce chips that are ready to use. Instead, there are many additional steps that must be completed, including cutting and separating chips from the wafer; assembling each chip to a lead frame which includes wire bonding, plastic or ceramic molding and cutting and forming the leads, positioning assembled chip onto a printed circuit board; and mounting the assembled chips to the printed circuit board. The cutting and assembly steps introduce many errors and defects due to the precise requirements of such operations. In addition, the positioning and mounting steps are naturally two-dimensional in character, and therefore do not support curved or three dimensional areas.

Therefore, due to these and various other problems, only a few companies in the world today can successfully manufacture conventional flat chips. Furthermore, the chips must bear a high price to cover the costs of manufacturing, as well as the return on initial capital and investment.

In addition to the above, one technology which may be used during semiconductor chip manufacturing includes chemical vapor deposition (CVD) technology. Existing chemical vapor deposition (CVD) technology uses low pressure in a vacuum processing chamber to form a metal layer, e.g., aluminum, on large diameter silicon wafers. A low pressure is required for obtaining a uniform layer over the wafer surface, since the wafer surface resides in the same position during deposition of the metal layer. In addition, vacuum sputtering processes are traditionally used in the semiconductor industry for making metal interconnects.

In U.S. Pat. No. 5,955,776, entitled "Spherical Shaped Semiconductor Integrated Circuit" and assigned to the same assignee as the present application, incorporated herein by reference, a method and apparatus for manufacturing spherical-shaped semiconductor integrated circuit devices is disclosed. The manufacturing of spherical shaped semiconductor integrated circuit devices as disclosed in U.S. Pat. No. 5,955,776 involves a continuous atmospheric semiconductor IC manufacturing process. As a result, deposition of metals using low pressure CVD techniques, as disclosed in the art with respect to flat semiconductor substrates, is incompatible for use in the manufacture of spherical shaped semiconductor substrate. An atmospheric CVD process for coating spherical shaped semiconductor substrates and integrated circuits would thus be desirable.

SUMMARY OF THE INVENTION

The present embodiments include an atmospheric CVD method and apparatus for depositing thin films on the surface of spherical shaped substrates and integrated circuit devices.

In accordance with one embodiment of the present disclosure, a method for metal-organics chemical vapor deposition (MO CVD) of a metal layer upon a spherical substrate at atmospheric pressure includes the steps of i) pretreating the spherical substrate with a vapor of a first precursor in preparation for a deposition of a metal layer, ii) exposing the pretreated spherical substrate to a thermally dissociated precursor of metal for depositing the metal layer onto the spherical substrate, the exposure to the thermally dissociated precursor of metal further providing a uniformly deposited metal layer coverage over the pretreated spherical substrate, iii) annealing the deposited metal layer, and iv) cooling the deposited metal layer.

Further in accordance with another embodiment of the present disclosure, a method for metal-organics chemical vapor deposition (MO CVD) of a metal layer upon a spherical substrate at atmospheric pressure includes the following steps. A spherical substrate is pretreated with a vapor of a first precursor in preparation for a deposition of a metal layer. The step of pretreating the spherical substrate includes exposing the surface of spherical substrate to the first precursor vapor to form nucleation sites for a subsequent metal deposition, the first precursor including a liquid tetrakisdimethylamino-titanium (TDMAT) precursor. The pretreated spherical substrate is then exposed to a thermally dissociated precursor of metal for depositing the metal layer onto the spherical substrate. The exposure to the thermally dissociated precursor of metal provides a uniformly deposited metal layer coverage over the pretreated spherical substrate, wherein the step of exposing the pretreated spherical substrate further includes using a thermally dissociated liquid dimethyl-aluminum hydride (DMAH) precursor. Next, the deposited metal layer is then annealed and cooled.

In accordance with yet another embodiment of the present disclosure, an apparatus for metal-organics chemical vapor deposition (MO CVD) of a metal layer upon a spherical substrate at atmospheric pressure includes means for pretreating the spherical substrate with a vapor of a first precursor in preparation for a deposition of a metal layer. A means for exposing the pretreated spherical substrate to a thermally dissociated precursor of metal is provided for depositing the metal layer onto the spherical substrate, the exposure to the thermally dissociated precursor of metal further providing a uniformly deposited metal layer coverage over the pretreated spherical substrate. A means for annealing the deposited metal layer is provided. Lastly, the apparatus further includes means for cooling the deposited metal layer.

In accordance with yet another embodiment, a spherical shaped integrated circuit manufacturing system for metal-organics chemical vapor deposition (MO CVD) of a metal layer upon a spherical semiconductor substrate at atmospheric pressure is disclosed. The system includes a pretreatment station for pretreating the spherical substrate with a vapor of a first precursor in preparation for a deposition of a metal layer. A metal deposition station is provided for exposing the pretreated spherical substrate to a thermally dissociated precursor of metal for depositing the metal layer onto the spherical substrate, the exposure to the thermally dissociated precursor of metal further providing a uniformly deposited metal layer coverage over the pretreated spherical substrate. An annealing station provides for annealing the deposited metal layer. A cooling station provides for cooling the deposited metal layer. Lastly, gas assisted delivery tubes interconnecting the stations provide for delivery of the spherical substrate between the stations.

BRIEF DESCRIPTION OF THE DRAWINGS

The foregoing and other teachings and advantages of the present invention will become more apparent upon a detailed description of the best mode for carrying out the invention as rendered below. In the description to follow, reference will be made to the accompanying drawings, in which:

FIG. 4 illustrates, in further detail, one embodiment of a pretreatment component of the atmospheric CVD system of FIG. 3 according to the present disclosure;

FIG. 5 illustrates, in further detail, one embodiment of the metal deposition/annealing/cooling component of the atmospheric CVD system of FIG. 3 according to the present disclosure;

DETAILED DESCRIPTION OF THE PREFERRED EMBODIMENTS

Figure 1:
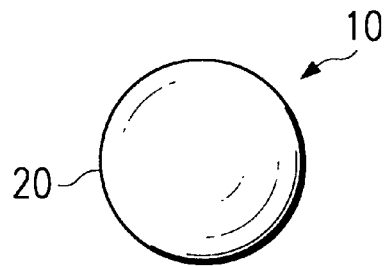
FIG. 1 shows an exemplary spherical shaped semiconductor substrate, also referenced herein as a spherical semiconductor substrate.

In accordance with the present disclosure, a metal-organic chemical vapor deposition (MO CVD) system and method are provided for forming a metal film layer on a spherical semiconductor substrate in an atmospheric process. FIG. 1 shows an exemplary spherical semiconductor substrate 10. Spherical semiconductor substrate 10 is on the order of a one millimeter (1 mm) diameter spherical substrate, however, other diameters are possible.

Figure 2:
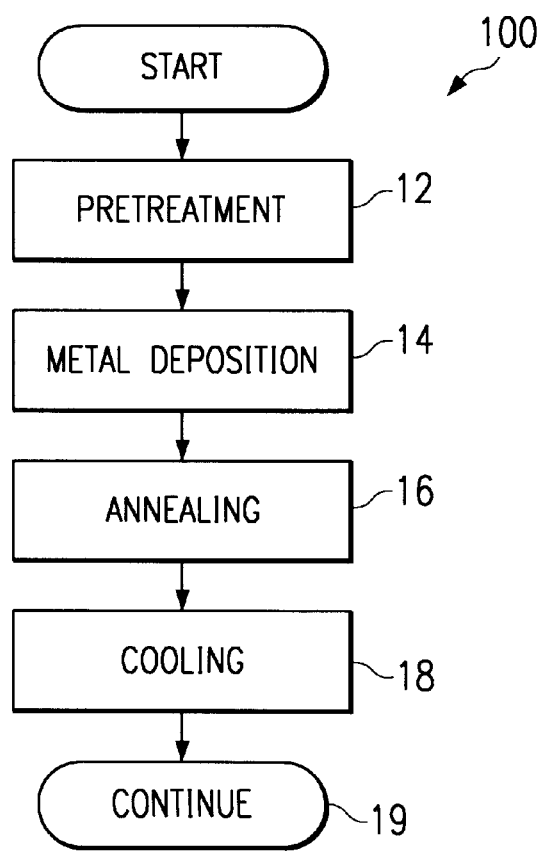
FIG. 2 illustrates in flow diagram form, an embodiment of the method for atmospheric CVD of a metal layer on a spherical semiconductor substrate according to the present disclosure.

Referring now to FIGS. 1 and 2, the MO CVD system and method 100 of the present disclosure includes pre-treatment 12, metal deposition 14, annealing 16, and cooling 18 processing steps as will be discussed further herein below. In addition, according to the MO CVD system and method 100 of the present disclosure, various prescribed gas streams are used to transport the spherical semiconductor substrate 10 throughout quartz tubes of a quartz reactor, the quartz tubes being used to interconnect the various processing stages or steps. Gas streams are also used between and during the series of processing steps. For example, gas streams are used to suspend the spherical semiconductor substrate 10 in each of a series of processing positions according to the particular series of processing steps as will be discussed herein below. In particular, for treatment at a particular processing step, a processing position is maintained with the use of a prescribed gas stream or streams in conjunction with a cone-shaped holding fixture, to be discussed further herein below.

With reference still to FIGS. 1 and 2, in a preferred embodiment, the metal film layer to be deposited upon the spherical substrate 10 includes aluminum. In the first step 12, with respect to the CVD deposition of an aluminum film layer, the surface 20 of the spherical semiconductor substrate 10 is pretreated by being exposed to a vapor of tetrakisdimethylamino-titanium (TDMAT) precursor to form nucleation sites for a subsequent aluminum deposition process. Pretreatment occurs at room temperature. Next in step 14, during metal deposition, a dimethyl-aluminum hydride (DMAH) precursor is thermally dissociated on the spherical semiconductor substrate surface 20, providing a uniform aluminum coverage over the pre-treated spherical substrate 10. The MO CVD method concludes with an annealing step 16, followed by a controlled cooling step 18. The metal coated spherical substrate 10 is then transported to a subsequent processing step to continue (step 19) the manufacture of a spherical semiconductor integrated circuit according to a desired process and design. In alternate embodiment, the pretreatment step 12 and metal deposition step 14 can be carried out using a direct liquid injection system, for example, including an inductively coupled plasma (ICP) delivery system, to be discussed further herein below with respect to FIGS. 6 and 7.

Figure 3:
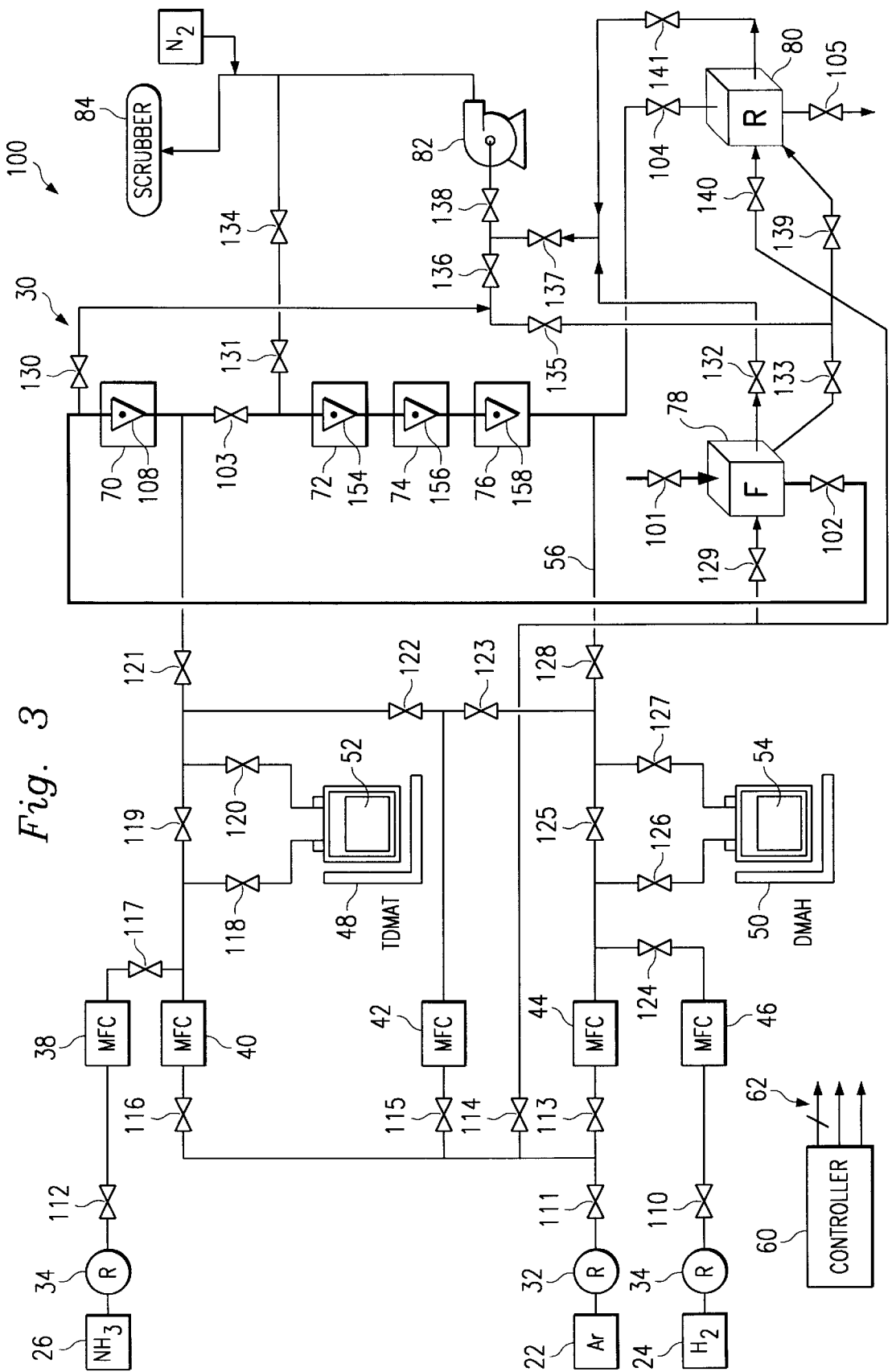
FIG. 3 illustrates an embodiment of the atmospheric CVD system for deposition of a metal layer on a spherical semiconductor substrate according to the present disclosure.

Referring now to FIG. 3, the MO CVD system 100 according to the present disclosure will now be described in further detail. Gas sources 22, 24 are provided for supplying gas which is to be used in transporting the spherical substrate 10 through the various processing steps of the present method. The gas sources 22 and 24 include argon (Ar), and hydrogen ($H_2$), respectively. An additional gas source 26 of $NH_3$ is provided, also. Various manual and air actuated pneumatic valves, identified with reference numerals 110–141, are used in a series of interconnected tubing for providing the necessary gas flows to the quartz reactor 30 of the present MO CVD system 100. Regulators 32, 34 and 36 are provided at a corresponding gas source for regulating a flow of gas from the particular source. Mass flow controllers 38, 40, 42, 44, and 46 are also provided for use in controlling the rate of flow of a particular gas. For example, gas regulators 32 and 34 are used to provide the carrier gases of either argon or hydrogen, or a mixture of both as controlled by mass flow controllers 40, 44 and 46 to the bubblers 48 and 50 containing the precursors. In one instance, argon gas can be used during a transport of a spherical substrate from one station to the next. In addition, argon and/or hydrogen may be used during the cooling step to cool the spherical substrate as discussed herein.

In one embodiment of the present method and apparatus, a first source of precursor 52 is provided for use during the pretreatment of the spherical substrate 10. The first source of precursor 52 includes the use of a bubbler 48, wherein the bubbler 48 contains the prescribed precursor 52. Similarly, a second source of precursor 54 includes the use of a bubbler 50. Bubblers are commercially available and thus only briefly described herein. The bubbler generally includes a stainless steel container, the containing having the prescribed liquid precursor inside. The bubbler further includes an IN valve 118 and an OUT valve 120. A carrier gas can be bubbled through the liquid precursor contained therein, thereby carrying precursor vapor out of the respective bubbler and onto the required processing station of the quartz reactor.

According to the present embodiments, carrier gas flow rates are controlled within the range of a 0 to 1000 sccm flow rate interval. The gases can be routed directly to the quartz reactor 30 through appropriate valves. For example, if valve 119 is closed, then gases are routed into the bubbler 48 through valve 118 and come out of the bubbler 48 through valve 120. Bubbler 50 is operated in a similar manner. As discussed, when the gases "bubble" through the liquid precursor, the gases entail some of its vapor. The precursor vapor is dragged into the quartz reactor 30 in a flow of the carrier gas. With respect to the DMAH precursor of bubbler 50, the gas line 56 from the bubbler 50 to the quartz reactor 30 is heated with a heating tape or element (not shown) to a temperature on the order of 20–30° C. higher than that of the bubbler 50. The bubbler itself can be heated to increase the vapor pressure, and hence, the deposition rate of the precursor. For instance, the DMAH bubbler 50 can be heated up to a temperature in the range of 50–70° C. The gas delivery system as described is capable of establishing a reliable gas flow into the quartz reactor 30 and also of providing a constant prescribed delivery rate of the chosen chemical.

The MO CVD system 100 of the present disclosure further includes a controller 60. The controller 60 provides process control through various output control signals 62, for example, signals for controlling valves and gas flows according to a desired CVD processing for a particular spherical substrate 10. Controller 60 can include any suitable commercially available controller, computer, or the like. The controller 60 is programmed using programming techniques known in the art, to perform the functions as described herein with respect to carrying out the process steps of the present disclosure.

In accordance with the present disclosure, a quartz reactor 30 for use in MO CVD of a spherical substrate 10 includes a pretreatment station 70, a metal CVD station 72, a sintering (or annealing) station 74 and a cooling station 76. The quartz reactor 30 further includes a feeder unit 78 positioned upstream from the pretreatment station 70 for feeding spherical substrates 10 to be processed into the quartz reactor 30. In addition, a receiver unit 80 is also provided downstream from the cooling station 76 for receiving MO CVD processed spherical substrates. The MO CVD processed spherical substrates are released from the receiver unit 80 into a subsequent processing reactor (not shown) for further processing according to a particular spherical semiconductor integrated circuit manufacturing process.

The feeder unit 78 includes a spherical substrate input port 101 and a spherical substrate output port 102. Feeder unit 78 further includes a transport gas input 129 and a transport gas output 132. The feeder unit 78 is used to control the rate at which spherical substrates to be processed are admitted into the quartz reactor 30 (i.e., at a prescribed feed rate).

The receiver unit 80 is similar to the feeder unit 78, however, the receiver unit 80 controls the rate of flow of spherical substrates released from the quartz reactor. Receiver unit 80 includes a spherical substrate input port 104 and a spherical substrate output port 105. Receiver unit 80 also includes a transport gas input 140 and a transport gas output 141.

The feeder unit 78 and the receiver unit 80 further include gas lines which can be used for purging or exhausting of a respective unit as may be desired from time to time (e.g. for removal of reaction by products or other undesired gases and/or substances from inside a respective unit). A dry vacuum pump 82 is provided to assist with the exhausting of the feeder unit 78 and the receiver unit 80. The dry vacuum pump 82 also provides low background pressure prior to CVD processing of a spherical substrate. Exhausting of the feeder unit 78 and the receiver unit 80 is carried out as needed for obtaining a desired state and/or condition within the respective unit.

A central scrubber 84 is also provided at the exhaust of the quartz reactor 30. The central scrubber 84 absorbs and removes reaction byproducts and chemicals from the reactor exhaust gas, wherein the byproducts and chemicals originate from the reactive process carried out within the quartz reactor 30. Nitrogen ($N_2$) gas 86 may also be supplied at the input of the scrubber 84 to assist with the scrubbing process. Scrubbers are typically known in the art, and thus only a brief description thereof has been provided herein.

Referring now to FIG. 4, the pretreatment station 70 of the MO CVD reactor 30 of the present disclosure shall be further described. The pretreatment station 70 includes a vertically disposed main section of tubing 90, preferably quartz tubing. A gas inlet 92 is positioned proximate a lower portion of the quartz tubing 90 as shown. The gas inlet 92 is further disposed generally perpendicular to the orientation of the main section 90. In addition, a gas outlet 94 is positioned proximate an upper portion of the main section of the quartz tubing 90. The gas outlet 94 is disposed generally perpendicular to the orientation of the main section 90. The main section 90 further includes a spherical substrate input port 96 and a spherical substrate output port 98. The main section 90 still further includes a conically tapered, funnel or cone-shaped section 102 as follows. The main section of quartz tubing 90 has a first diameter D1. The conically tapered section 102 includes a first cone 104 in which the inner diameter of the tubing is reduced from diameter D1 to diameter D2, where D1 is greater than D2. In one embodiment the cone wall of the first cone 104 which facilitates the diameter D1 to D2 reduction is at an angle $\phi$ on the order of approximately 30° with the wall of the main section 90 of the tubing. The conically tapered section 102 further includes a second cone 106 in which the inner diameter of the tubing is enlarged from diameter D2 to diameter D1. In addition, in one embodiment, the cone wall of the second cone 106 is sloped at an angle φ on the order of 30° with respect to the side wall of the main section of the tubing 90. Note that angles other than 30° may be suitable also. Extending between the first cone and the second cone is an intermediate tube section 105 having a diameter on the order of D2. Diameters D1 and D2 are larger than the diameter of the spherical substrates to be processed. Length dimensions of respective portions of the tubing and conical-tapered section of the pretreatment station 70 are selected to obtain a desired substrate transport, in combination with flow rates of transport gases.

During pretreatment (step 12 of FIG. 2), gas containing precursor vapor is input into the gas inlet 92 at a particular rate sufficient to maintain the spherical substrate 10 to be processed in a holding position within or proximate to the first cone 104. The area within or proximate to the first cone 104 can be referred to as the cone-shaped spherical substrate holder 108, as discussed herein. For pretreatment processing, a spherical substrate 10 to be processed enters a substrate inlet port 96 of the pretreatment station 70. The substrate 10 then proceeds to the cone-shaped spherical substrate holder 108. While positioned at the substrate holder 108, the substrate 10 is pretreated according to a desired pretreatment. In a preferred embodiment, the pretreatment step 12 (FIG. 2) includes exposing the substrate 10 to a vapor of TDMAT to form nucleation sites for a subsequent aluminum deposition process for a duration on the order of 10 seconds to one minute. Subsequent to a given pretreatment, the substrate 10 then proceeds through the intermediate tube section 105 of the conically tapered section 102 and is then released (i.e., exits) from the pretreatment station 70 via a spherical substrate outlet port 98. Suitable control of the gas flow through the pretreatment station 70 by controller 60 (FIG. 3) enables the substrate to descend as needed. That is, the rate of descent of a spherical substrate 10 through the pretreatment station 70 is controlled via the flow rate of transport gas and/or pretreatment gas which is flowed into the gas inlet 92 and out of the gas outlet 94, further as controlled by controller 60. Release of the spherical substrate 10 from the pretreatment station 70 is accomplished by the opening of the substrate valve 103 disposed between the pretreatment station and the metal CVD station 72. Opening of the substrate valve 103 produces a pressure drop, thus causing the substrate 10 to descend from the pretreatment station 70 into the metal CVD station 72. During a pretreatment of the spherical substrate 10, the substrate inlet port 96 and substrate outlet port 98 are closed off using corresponding respective substrate valves 102 and 103, respectively.

Referring now to FIG. 5, a second portion of the quartz reactor 30 for the MO CVD system 100 of the present disclosure will now be discussed. The second portion includes an MO CVD station 72, a sintering (i.e., annealing) station 74, and a cooling station 76. The second portion includes a vertically disposed main section of tubing 142, preferably quartz tubing. A gas inlet 144 is positioned proximate a lower portion of the quartz tubing 142 as shown. The gas inlet 144 is further disposed generally perpendicular to the orientation of the main section 142. In addition, a gas outlet 146 is positioned proximate an upper portion of the main section 142 of the quartz tubing. The gas outlet 146 is disposed generally perpendicular to the orientation of the main section.

With reference still to FIG. 5, the main section 142 further includes first, second, and third conically tapered, funnel or cone shaped sections 148, 150, and 152, respectively, as follows. As with the pretreatment station 70, the main section 142 of the quartz tubing has a first diameter of D1. Each conically tapered section includes a first cone, a second cone, and an intermediate section. The first cone is characterized by the inner diameter of the quartz tubing being reduced from diameter D1 to a diameter D2, where D1 is larger than D2. With respect to the second cone, the inner diameter of the tubing is enlarged from diameter D2 to diameter D1. The intermediate section is characterized by a diameter on the order of diameter D2. In addition, the cone walls can be sloped, for example, at an angle φ on the order of 30° or other suitable angle with respect to the side wall of tubing of the main section 142, similar to that as discussed with the conical tapered section of the pretreatment station of FIG. 4.

During CVD deposition of metal (step 14 of FIG. 2) onto the spherical substrate 10, gas containing the metal precursor vapor is input into the gas inlet 144 at a particular rate sufficient to maintain the spherical substrate 10 to be processed in a holding position within or proximate to the first cone 154 in the metal deposition station 72 of the quartz reactor 30. In a preferred embodiment, the metal precursor vapor includes DMAH precursor 54 (FIG. 3) for providing a uniform aluminum coverage over the pretreated spherical substrate 10. The metal precursor vapor is provided by a prescribed carrier gas bubbling through the source DMAH liquid 54 contained in the bubbler 50 of FIG. 3. A metal deposition can be carried out for a duration on the order of 30 seconds to two (2) minutes, or as required for a desired deposition. In addition, the DMAH precursor 54 is thermally dissociated to provide a uniform aluminum coverage over the pre-treated spherical substrate 10. The temperature range for the DMAH dissociation is from about 200 to 300° C. An argon (Ar) gas 22 flow rate for metal CVD deposition processing is established on the order of 250 sccm (standard cubic centimeters per minute). Hydrogen ($H_2$) gas 24 may also be used in a mixture with argon (Ar) as a carrier gas, resulting in a more purer deposited film.

As with the pretreatment station 70, the first cone 154 of the metal deposition station 72 is also referred to as a cone-shaped spherical substrate holder. The sintering station 74 and the cooling station 76 each also include cone-shaped spherical substrate holders, 156 and 158, respectively, as shown in FIG. 5.

Subsequent to a given MO CVD deposition at deposition station 72, the substrate 10 is then caused to proceed or descend through the intermediate tube section of the conically tapered section 148 of the metal deposition station 72. The rate of descent of the spherical substrate 10 through the metal deposition station 72 is controlled via the flow rate of the gases which are input through the gas input port 144 and output through the gas output port 146. During metal deposition, the spherical substrate input port 160 and spherical substrate output port 162 of the second section of the MO CVD reactor 30 are closed off via corresponding respective substrate flow control valves 103 and 104, respectively.

Referring still to FIG. 5, following a metal deposition in the metal deposition station 72, the spherical substrate 10 descends to the cone-shaped spherical substrate holder 156 of the sintering or annealing station 74. The sintering station 74 includes a heating device or furnace 164 disposed proximate the cone-shaped spherical substrate holder 156. The heating device or furnace 164 provides a prescribed heating of the substrate 10 as required. In a preferred embodiment, sintering (step 16 of FIG. 2) occurs at temperatures in the range of about 350–450° C. for a given time duration, for example, on the order of about 30 minutes. Sintering or annealing is carried out for the purpose of electrically activating the deposited metal coating or aluminum film, to heal any damage in the aluminum film, and to decrease the resistance of the deposited film.

Heating device or furnace 164 includes any suitable heating element or elements, for example, a heating coil disposed in a wrapped fashion about the quartz tubing 142. That is, the heating device 164 is positioned in a manner suitable for heating the region of the quartz reactor 30 which encloses the spherical substrate 10, to heat the spherical substrate 10 to a desired temperature during sintering. Control of the heating device is handled by suitable control signals 62 of the controller 60. Upon a desired sintering of the substrate 10 in the sintering station 74, the substrate 10 is allowed to descend to the cooling station 76. Descent of the substrate 10 is controlled by appropriate adjustments in the gas flow into and out of the second section of the quartz reactor 30 via gas inlet 144 and gas outlet 146.

With reference still to FIG. 5, the substrate 10 is transported from the sintering station 74 to the cooling station 76 as follows. The substrate 10 descends to the cone-shaped spherical substrate holder 158 of the cooling station 76. While in the substrate holding position, gas is allowed to flow past the substrate 10, effectively cooling the substrate as needed to obtain a desired cooling (step 18 of FIG. 2). In a preferred embodiment, the heat conductivity of the cooling gas is used to cool the substrate 10 to a temperature on the order of 25–50° C. or room temperature, for a given time duration, for example, on the order of five (5) minutes. Upon completion of cooling, the substrate 10 is allowed to descend out of the substrate output port 162 of the second section and into the spherical substrate receiver 80 (FIG. 3). As mentioned herein above, the substrate receiver 80 controls the rate of flow of processed spherical substrates out of the MO CVD reactor 30 and on to further processing steps according to the particular requirements of a given spherical substrate integrated circuit design. In connection with the second section of reactor 30, length dimensions of respective portions of the tubing and conical-tapered sections of the metal deposition, sintering, and cooling stations 72, 74, and 76, respectively, are selected to obtain a desired substrate transport, in combination with flow rates of transport gases.

In the MO CVD system 100 of the present disclosure, conventional materials can be used to construct the same. For example, the gas delivery lines can be made of stainless steel. In addition, the reactor tubes are preferably made of quartz, however, other suitable materials may be used.

In an alternate embodiment, ammonia ($NH_3$) 26 (FIG. 3) can be used as a reducing agent in addition to the TDMAT precursor 52. The ammonia and TDMAT are used to form a titanium nitride layer on the silicon surface 20 of the spherical substrate 10 prior to the aluminum CVD deposition. Using a suitable furnace (not shown) in conjunction with the pretreatment station of FIG. 4, the titanium nitride layer is deposited onto the surface of the spherical substrate prior to the aluminum deposition. The titanium nitride deposition promotes an improved receptivity for the aluminum deposition. In other words, instead of the room temperature pretreatment of TDMAT precursor 52, ammonia and TDMAT heated to a temperature on the order of 300–400° C. can be used during a pretreatment to form a titanium nitride layer on the surface 20 of the silicon spherical substrate 10. Titanium nitride is a conductive layer, which makes it easier for aluminum to be nucleated onto the nitride rather than silicon or silicon oxide. Titanium nitride thus provides an improved seed layer than silicon or silicon dioxide.

Figure 6:
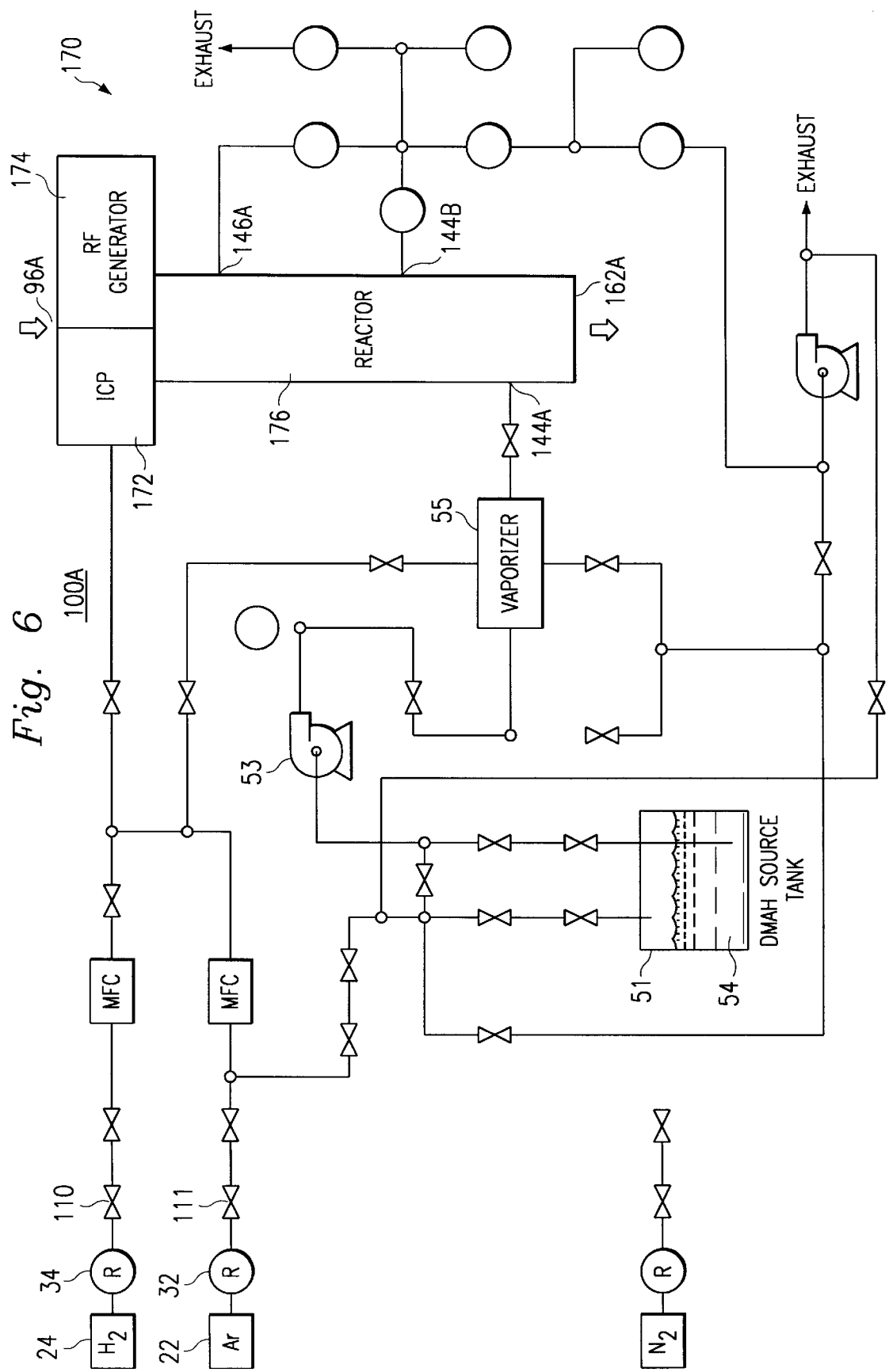
FIG. 6 illustrates, an alternate embodiment of the atmospheric CVD system according to the present disclosure, including a direct liquid injection system.

In yet another alternate embodiment, the atmospheric pressure CVD system 100A includes a reactor 170 having an inductively coupled plasma device 172 which is used as the pretreatment station 70A, as discussed herein. The atmospheric pressure MO CVD system 100A is illustrated in FIG. 6. The MO CVD system 100A further includes a direct liquid injection system. The direct liquid injection system includes a source tank 51 of DMAH precursor 54, a pump 53, and a vaporizer 55. Vaporizer 55 may include any suitable vaporizer, such as commercially available from MKS Instruments. With the above, the atmospheric pressure ICP reactor 170 provides a means for pretreatment of the surface 20 of spherical substrate 10. The direct liquid injection system provides a means for aluminum CVD deposition on the pretreated substrate surface 20. ICP reactors are generally known in the art and thus only briefly described herein. The ICP reactor 170 is modified for appropriate handling of spherical substrates in a manner similar to that as shown and described with respect to FIGS. 4 and 5.

Figure 7:
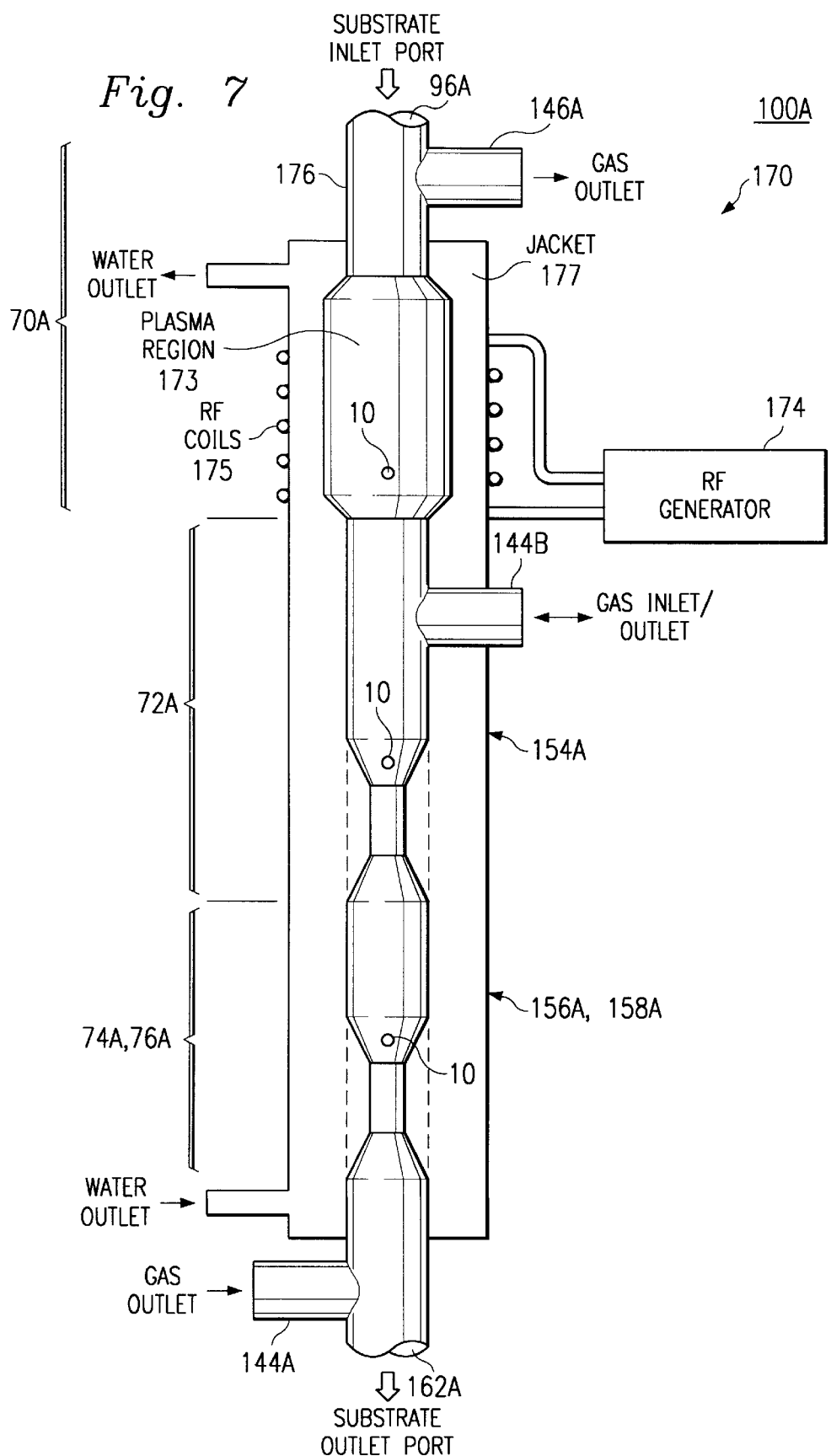
FIG. 7 illustrates, in further detail, the reactor component of the atmospheric CVD system of FIG. 6.

With reference still to the ICP reactor 170 of FIGS. 6 and 7, the spherical ICs or substrates can be subjected to atmospheric inductively coupled plasma pretreatment. FIGS. 6 and 7 illustrate the set-up for an ICP Ar—$H_2$ surface pretreatment. The ICP reactor 170 includes an inductively coupled plasma torch 172 of known construction, an RF generator 174, matching network (not shown), and a control panel (not shown) which are utilized to produce an atmospheric plasma discharge. A water jacket 177 is used to enclose the plasma region 173 to avoid overheating. An inductance RF coil 175 is wrapped over the quartz tube region of larger diameter sufficient to ignite the ICP. An inductive coupling of the RF power supplied by the coil 175 to the carrier gas provides the plasma of a toroidal shape. A mixture of argon and hydrogen gases, typically Ar—4–5% $H_2$ is used to form the ICP. The plasma spreads out of the RF coil region throughout the tube length to the region where the spherical substrate is suspended for pretreatment. The spherical substrate is suspended in the discharge region of the plasma for a period of time sufficient for hydrogen passivation of the silicon surface of the spherical substrate. The plasma is created inside the quartz tubing of the quartz reactor 170. The spherical substrate is maintained held in the plasma region by regulating the flow of transport gases as appropriate.

With reference still to FIGS. 6 and 7, liquid precursor is delivered from the source tank 51 via pump 53 to the vaporizer 55. The vaporizer 55 vaporizes the liquid precursor 54, which is then input into the reactor tube 176. The vaporizer 55 is proximate the reactor 170. Furthermore, vapor is formed by the vaporizer 55 immediately proximate the point of entry into the reactor tube 176. Atmospheric pressure liquid precursor vapor enters the ICP reactor 170 at gas input port 144A and outport at gas output port 146A. The length dimensions of various portions of the tubing and conical-tapered sections of the reactor 170 of FIG. 7 for the pretreatment station 70A, CVD deposition station 72A, and sintering station 74A or cooling station 76A are chosen to obtain a desired substrate transport, in combination with flow rates of transport gases. During Al CVD deposition with the liquid precursor vapor, the spherical substrate 10 is positioned at the cone-shaped substrate holder 154A. During sintering, the spherical substrate 10 may be positioned at the cone-shaped substrate holder 156A. During cooling, the spherical substrate 10 can be positioned at the cone-shaped substrate holder 158A. An alternate gas inlet/outlet 144B may also be provided as necessary to obtain a desired gas flow.

In further discussion with respect to the delivery of a precursor vapor to the substrate to be processed during a given MO CVD processing step according to the present disclosure, two different methods have been discussed herein. One method includes the use of bubblers and the other includes the use of direct liquid injection. In FIG. 3, the TDMAT precursor vapor is delivered using a bubbler. The TDMAT precursor vapor, however, may also be delivered using direct liquid injection, similarly as with the direct liquid injection of the DMAH precursor as shown in FIG. 6. With respect to the use of the bubbler, the carrier gas (e.g., Ar) goes through the liquid precursor and entails some vapor. For Al deposition, the vapor is then delivered into a heated zone, where the precursor thermally dissociates upon reaching the spherical substrate surface. Thermal dissociation provides a mechanism by which Al is being deposited upon the spherical silicon substrate surface. With respect to the use of direct liquid injection, the liquid precursor is pumped into a vaporizer, the vaporizer containing rotating disks, for example. The liquid precursor splashes upon the disk surfaces of the vaporizer and vaporizes, the vaporizer further including a heater. The vapor is then drawn into the reactor tube by a gas flow (e.g., Ar) going through the vaporizer and into the reactor tube. The vapor thermally dissociates on the spherical silicon substrate surface. The mechanism for vapor deposition on the spherical substrate is the same in both instances, however, the delivery method is either with the use of a bubbler or the use of direct liquid injection. Further with respect to the delivery methods, direct liquid injection is preferred, as it is a more advanced technique.

The present MO CVD method and apparatus thus advantageously provides an atmospheric pressure CVD process for coating spherical shaped semiconductor substrates in the fabrication of spherical semiconductor integrated circuits. In this manner, the present MO CVD method and apparatus overcome the problem discussed herein above with respect to the fact that no vacuum process is tolerated in the continuous, spherical integrated circuit manufacturing system, as disclosed in U.S. Pat. No. 5,955,776. Lastly, the present MO CVD method and apparatus advantageously provide a gaseous, chemical reaction based, all-CVD process which is highly useful in the continuous spherical semiconductor integrated circuit manufacturing process. Prior to the discovery of the MO CVD method and apparatus of the present disclosure, no known atmospheric CVD process had been developed for the coating of spherical integrated circuits.

Further in accordance with the MO CVD method and apparatus of the present disclosure, a manufacturing process and system are provided for atmospheric pressure thin film coating of spherically shaped semiconductor integrated circuits. During the manufacture of film layers on the surface of the spherical substrate, film layer uniformity is obtained through the spinning of the spherical substrate in the gaseous flows, i.e., at atmospheric pressure. In addition, since the spherical substrates are also transported by the use of gas streams, the entire manufacturing process is conducted at atmosphere. The present embodiments thus capitalize on the advantages of atmospheric gas phase reaction and suspension techniques. The present embodiments further allow for a novel method of depositing blanket metal films, in particular, aluminum, over small spherical semiconductor substrates. As mentioned herein above, the spherical semiconductor substrates are on the order of approximately one millimeter (1 mm) in diameter.

The present embodiments thus advantageously provide an atmospheric pressure aluminum CVD method and apparatus for use in the manufacture of spherical semiconductor integrated circuits.

While the invention has been particularly shown and described with reference to the preferred embodiment thereof, it will be understood by those skilled in the art that various changes in form and detail may be made therein without departing form the spirit and scope of the invention, as set forth in the following claims.

What is claimed is:

1. A method for metal-organics chemical vapor deposition (MO CVD) of a metal layer upon a spherical substrate at atmospheric pressure, said method comprising the steps of:
   pretreating the spherical substrate with a vapor of a first precursor in preparation for a deposition of a metal layer;
   exposing the pretreated spherical substrate to a vapor of thermally dissociated metal precursor for depositing the metal layer onto the spherical substrate, the exposure to the thermally dissociated metal precursor further providing a uniformly deposited metal layer coverage over the pretreated spherical substrate;
   annealing the deposited metal layer; and
   cooling the deposited metal layer.

2. The method of claim 1, wherein pretreating the spherical substrate includes exposing the surface of spherical substrate to the first precursor vapor to form nucleation sites for a subsequent metal layer deposition.

3. The method of claim 2, wherein pretreating the spherical substrate further includes exposing the surface of the spherical substrate to a vapor of tetrakisdimethylaminotitanium (TDMAT) precursor.

4. The method of claim 3, wherein the vapor of TDMAT precursor is delivered using direct liquid injection.

5. The method of claim 1, wherein exposing the pretreated spherical substrate to a vapor of thermally dissociated metal precursor for depositing the metal layer onto the spherical substrate includes using a thermally dissociated liquid dimethyl-aluminum hydride (DMAH) precursor.

6. The method of claim 5, wherein the vapor of DMAH precursor is delivered using direct liquid injection.

7. The method of claim 5, further including
   providing a bubbler for containing the liquid DMAH precursor;
   providing a quartz tube for use during exposure of the pretreated spherical substrate to the thermally dissociated metal precursor vapor;
   providing a gas line extending between the bubbler and the quartz tube for delivery of the thermally dissociated metal precursor vapor to the pretreated spherical substrate; and
   heating the gas line to a temperature on the order of 20–30° C. higher than that of the bubbler.

8. The method of claim 7, still further including
   heating the bubbler to a prescribed temperature on the order of 50–70° C. to increase a vapor pressure, and thus a deposition rate of the DMAH precursor.

9. The method of claim 1, wherein annealing the deposited metal layer includes annealing the deposited metal coating in a range from about 350 to 450° C. for electrically activating the metal layer.

10. The method of claim 1, wherein pretreating the spherical substrate includes subjecting the spherical substrate to an atmospheric inductively coupled plasma (ICP) treatment.

11. The method of claim 10, wherein the ICP treatment includes an Ar—$H_2$ surface pretreatment.

12. The method of claim 1, further including the steps of transporting the spherical substrate between processing steps using gas delivery lines.

13. A method for metal-organics chemical vapor deposition (MO CVD) of a metal layer upon a spherical substrate at atmospheric pressure, said method comprising the steps of:

pretreating the spherical substrate with a vapor of a first precursor in preparation for a deposition of a metal layer, wherein said step of pretreating the spherical substrate includes exposing the surface of spherical substrate to the first precursor vapor to form nucleation sites for a subsequent metal deposition, the first precursor including a liquid tetrakisdimethylamino-titanium (TDMAT) precursor;

exposing the pretreated spherical substrate to a vapor of thermally dissociated metal precursor for depositing the metal layer onto the spherical substrate, the exposure to the vapor of thermally dissociated metal precursor further for providing a uniformly deposited metal layer coverage over the pretreated spherical substrate, wherein said step of exposing the pretreated spherical substrate further includes using a thermally dissociated liquid dimethyl-aluminum hydride (DMAH) precursor;

annealing the deposited metal layer; and cooling the deposited metal layer.

14. The method of claim 13, wherein said step of pretreating the spherical substrate still further includes placing the liquid TDMAT precursor in a bubbler and having a first carrier gas bubble through the liquid TDMAT precursor at a prescribed gas flow rate to entail precursor vapor in a flow of the first carrier gas which is delivered to the spherical substrate;

said step of exposing the pretreated spherical substrate to the vapor of thermally dissociated metal precursor still further includes having a second carrier gas bubble through the liquid DMAH precursor at a prescribed gas flow rate to entail precursor vapor in a flow of the second carrier gas which is delivered to the pretreated spherical substrate.

15. The method of claim 13, further including providing a bubbler for containing the liquid DMAH precursor;

providing a quartz tube for use during exposure of the pretreated spherical substrate to the thermally dissociated metal precursor vapor;

providing a gas line extending between the bubbler and the quartz tube for delivery of the thermally dissociated metal precursor vapor to the pretreated spherical substrate; and heating the gas line to a temperature on the order of 20–30° C. higher than that of the bubbler.

16. The method of claim 15, still further including heating the bubbler to a prescribed temperature on the order of 50–70° C. to increase a vapor pressure, and thus a deposition rate of the DMAH precursor.

17. The method of claim 13, wherein the vapor of TDMAT precursor is delivered using direct liquid injection.

18. The method of claim 13, wherein the vapor of DMAH precursor is delivered using direct liquid injection.

19. An apparatus for metal-organics chemical vapor deposition (MO CVD) of a metal layer upon a spherical substrate at atmospheric pressure, said apparatus comprising:

means for pretreating the spherical substrate with a vapor of a first precursor in preparation for a deposition of a metal layer;

means for exposing the pretreated spherical substrate to a vapor of thermally dissociated metal precursor for depositing the metal layer onto the spherical substrate, the exposure to the thermally dissociated metal precursor further providing a uniformly deposited metal layer coverage over the pretreated spherical substrate;

means for annealing the deposited metal layer;

means for cooling the deposited metal layer; and means for transporting the spherical substrate between said pretreatment means, said exposing means, said annealing means, and said cooling means.

20. The apparatus of claim 19, wherein said means for pretreating the spherical substrate includes means for exposing the surface of spherical substrate to the first precursor vapor to form nucleation sites for a subsequent metal layer deposition.

21. The apparatus of claim 20, wherein said means for pretreating the spherical substrate further includes means for exposing the surface of the spherical substrate to a vapor of tetrakisdimethylamino-titanium (TDMAT) precursor.

22. The apparatus of claim 19, wherein said means for exposing the pretreated spherical substrate to a vapor of thermally dissociated metal precursor includes a thermally dissociated liquid dimethyl-aluminum hydride (DMAH) precursor.

23. The apparatus of claim 22, further including a bubbler for containing the liquid DMAH precursor;

a quartz tube for use during exposure of the pretreated spherical substrate to the thermally dissociated metal precursor vapor;

a gas line extending between said bubbler and said quartz tube for delivery of the thermally dissociated metal precursor vapor to the pretreated spherical substrate; and means for heating the gas line to a temperature on the order of 20–30° C. higher than that of said bubbler.

24. The apparatus of claim 23, wherein said heating means includes means for heating the bubbler to a prescribed temperature on the order of 50–70° C. to increase a vapor pressure, and thus a deposition rate of the DMAH precursor.

25. The apparatus of claim 19, wherein the vapor of first precursor is delivered using direct liquid injection.

26. The apparatus of claim 19, wherein the vapor of metal precursor is delivered using direct liquid injection.

27. The apparatus of claim 19, wherein said annealing means includes means for annealing the deposited metal coating in a range from about 350 to 450° C. for electrically activating the metal layer.

28. The apparatus of claim 19, wherein said means for pretreating the spherical substrate includes an atmospheric inductively coupled plasma (ICP) treatment system.

29. The apparatus of claim 28, wherein the ICP treatment system includes an Ar—$H_2$ surface pretreatment system.

30. An apparatus for metal-organics chemical vapor deposition (MO CVD) of a metal layer upon a spherical substrate at atmospheric pressure, said apparatus comprising:

means for pretreating the spherical substrate with a vapor of a first precursor in preparation for a deposition of a metal layer, wherein said pretreating means includes means for exposing the surface of spherical substrate to the first precursor vapor to form nucleation sites for a subsequent metal deposition, the first precursor including a liquid tetrakisdimethylamino-titanium (TDMAT) precursor;

means for exposing the pretreated spherical substrate to a vapor of thermally dissociated metal precursor for depositing the metal layer onto the spherical substrate, wherein exposure to the vapor of thermally dissociated metal precursor provides a uniformly deposited metal layer coverage over the pretreated spherical substrate, the thermally dissociated precursor including a thermally dissociated liquid dimethyl-aluminum hydride (DMAH) precursor;

means for annealing the deposited metal layer; and means for cooling the deposited metal layer.

31. The apparatus of claim 30, wherein said pretreating means still further includes a bubbler for containing the liquid TDMAT precursor, said pretreating means further including a first carrier gas for bubbling through the liquid TDMAT precursor at a prescribed gas flow rate to entail precursor vapor in a flow of the first carrier gas which is delivered to the spherical substrate;

said exposing means still further includes a bubbler for containing the liquid DMAH precursor, said exposing means still further including a second carrier gas for bubbling through the liquid DMAH precursor at a prescribed gas flow rate to entail precursor vapor in a flow of the second carrier gas which is delivered to the pretreated spherical substrate.

32. The apparatus of claim 30, further including a bubbler for containing the liquid DMAH precursor;

a quartz tube for use during exposure of the pretreated spherical substrate to the thermally dissociated metal precursor vapor;

a gas line extending between said bubbler and said quartz tube for delivery of the thermally dissociated metal precursor vapor to the pretreated spherical substrate; and means for heating the gas line to a temperature on the order of 20–30° C. higher than that of said bubbler.

33. The apparatus of claim 32, wherein said heating means is further for heating said bubbler to a prescribed temperature on the order of 50–70° C. to increase a vapor pressure, and thus a deposition rate of the DMAH precursor.

34. The apparatus of claim 30, wherein the vapor of first precursor is delivered using direct liquid injection.

35. The apparatus of claim 30, wherein the vapor of metal precursor is delivered using direct liquid injection.

36. A system for manufacturing spherical shaped integrated circuits, for metal-organics chemical vapor deposition (MO CVD) of a metal layer upon a spherical semiconductor substrate at atmospheric pressure, said system comprising:

pretreatment station for pretreating the spherical substrate with a vapor of a first precursor in preparation for a deposition of a metal layer;

metal deposition station for exposing the pretreated spherical substrate to a vapor of thermally dissociated metal precursor for depositing the metal layer onto the spherical substrate, the exposure to the thermally dissociated metal precursor further providing a uniformly deposited metal layer coverage over the pretreated spherical substrate;

annealing station for annealing the deposited metal layer;

cooling station for cooling the deposited metal layer; and gas assisted delivery tubes interconnecting said stations for delivery of the spherical substrate between said stations.

37. The system of claim 36, further comprising:

spherical substrate holders located at each of said stations, said spherical substrate holders for assisting in the positioning of the spherical substrate at a respective station for a prescribed duration during a processing step at a respective station.

38. The system of claim 37, wherein each of said spherical substrate holders is characterized by a conical shaped surface.

39. The system of claim 36, further comprising:

feeder means coupled to said pretreatment station for dispensing spherical substrates to be processed into said gas delivery assisted tubes at a prescribed delivery rate.

40. The system of claim 36, further comprising:

receiver means coupled to said cooling station for controlling a release of processed spherical substrates from said gas delivery assisted tubes at a prescribed release rate.

41. The system of claim 36, further comprising:

first vapor delivery system for controllably generating and delivering the first precursor vapor from a first vapor source to said pretreatment station at a prescribed delivery rate;

second vapor delivery system for controllably generating and delivering a vapor of the thermally dissociated metal precursor from a second vapor source to said metal deposition station at a prescribed delivery rate.

42. The system of claim 41, wherein the first vapor source includes a liquid tetrakisdimethylamino-titanium (TDMAT) precursor, and the second vapor source includes a liquid dimethyl-aluminum hydride (DMAH) precursor.

43. The system of claim 36, wherein the vapor of first precursor is delivered using direct liquid injection.

44. The system of claim 36, wherein the vapor of metal precursor is delivered using direct liquid injection.

* * * * *